US012684858B2

(12) United States Patent
Wang et al.

(10) Patent No.: US 12,684,858 B2
(45) Date of Patent: Jul. 14, 2026

(54) PROCESS INTEGRATION METHOD FOR IMPROVING LEAKAGE IN MV DEVICE

(71) Applicant: Shanghai Huali Integrated Circuit Corporation, Shanghai (CN)

(72) Inventors: Qiwei Wang, Shanghai (CN); Yaoyu Zhan, Shanghai (CN); Tao Liu, Shanghai (CN); Zhigang Zhang, Shanghai (CN); Haoyu Chen, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 391 days.

(21) Appl. No.: 18/463,241

(22) Filed: Sep. 7, 2023

(65) Prior Publication Data

US 2024/0282635 A1      Aug. 22, 2024

(30) Foreign Application Priority Data

Feb. 21, 2023 (CN) .......................... 202310146678.X

(51) Int. Cl.
| | |
|---|---|
| *H10D 84/03* | (2025.01) |
| *H10D 84/01* | (2025.01) |
| *H10D 84/83* | (2025.01) |

(52) U.S. Cl.
CPC ....... *H10D 84/038* (2025.01); *H10D 84/0142* (2025.01); *H10D 84/0144* (2025.01); *H10D 84/0147* (2025.01); *H10D 84/83* (2025.01)

(58) Field of Classification Search
CPC ............. H10D 84/038; H10D 84/0142; H10D 84/0144; H10D 84/0147; H10D 84/83; H10D 84/8311; H10D 84/8312; H10D 84/83138; H10D 84/8314; H10D 84/0135
See application file for complete search history.

(56) References Cited

U.S. PATENT DOCUMENTS

| | | | |
|---|---|---|---|
| 8,772,147 B2 * | 7/2014 | Teo ........................ | H10D 64/01 438/257 |
| 2023/0154922 A1 * | 5/2023 | Yang .................. | H10D 84/0142 257/369 |

* cited by examiner

*Primary Examiner* — Fernando L Toledo
*Assistant Examiner* — Jorge Andres Lopez
(74) *Attorney, Agent, or Firm* — Banner & Witcoff, Ltd.

(57) ABSTRACT

The application discloses a process integration method for improving leakage in MV devices, comprising: step I: forming gate structures, step II: depositing a first spacer material layer, step III: forming an additional spacer material layer, step IV: forming a first mask layer to cover an MV device formation region and open an LV device formation region, step V: performing an isotropic first etching to remove the additional spacer material layer from the LV device formation region, step VI: performing an anisotropic second etching to form a first layer of spacers of the low voltage region, step VII: forming a second mask layer to open the MV device formation region and to cover the LV device formation region, step VIII: performing an anisotropic third etching to form a first layer of spacers of the medium voltage region and additional spacers, and step IX: depositing and etching a second spacer material layer.

15 Claims, 12 Drawing Sheets

Step I. forming a first gate structure of an MV device and a second gate structure of an LV device on a semiconductor substrate.

Step II. depositing a first spacer material layer.

Step III. forming an additional spacer material layer.

Step IV. forming a first mask layer to cover an MV device formation region and open an LV device formation region.

Step V. performing an isotropic first etching to remove the additional spacer material layer of the LV device formation region.

Step VI. performing an anisotropic second etching to form a first layer of spacers of the low voltage region.

Step VII. forming a second mask layer to open the MV device formation region and to cover the LV device formation region.

Step VIII. performing an anisotropic third etching to form a first layer of spacers of the medium voltage region and additional spacers.

Step IX. depositing and etching a second spacer material layer to simultaneously form a second layer of spacers of the medium voltage region and a second layer of spacers of the low voltage region.

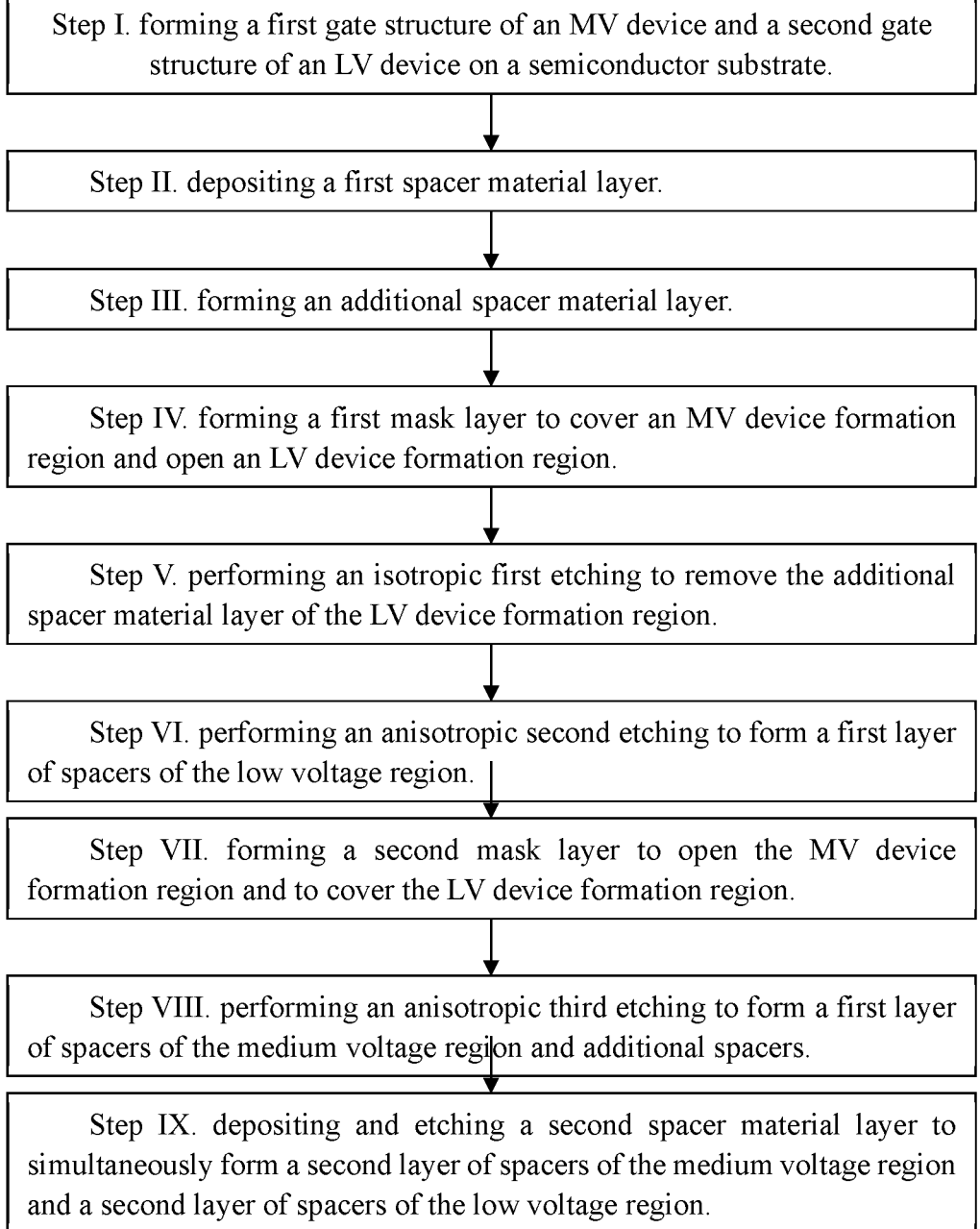

Step I. forming a first gate structure of an MV device and a second gate structure of an LV device on a semiconductor substrate.

Step II. depositing a first spacer material layer.

Step III. forming an additional spacer material layer.

Step IV. forming a first mask layer to cover an MV device formation region and open an LV device formation region.

Step V. performing an isotropic first etching to remove the additional spacer material layer of the LV device formation region.

Step VI. performing an anisotropic second etching to form a first layer of spacers of the low voltage region.

Step VII. forming a second mask layer to open the MV device formation region and to cover the LV device formation region.

Step VIII. performing an anisotropic third etching to form a first layer of spacers of the medium voltage region and additional spacers.

Step IX. depositing and etching a second spacer material layer to simultaneously form a second layer of spacers of the medium voltage region and a second layer of spacers of the low voltage region.

Figure 2

PROCESS INTEGRATION METHOD FOR IMPROVING LEAKAGE IN MV DEVICE

CROSS-REFERENCES TO RELATED APPLICATIONS

This application claims the priority to Chinese patent application No. 202310146678.X, filed on Feb. 21, 2023, and entitled "PROCESS INTEGRATION METHOD FOR IMPROVING LEAKAGE IN MV DEVICE", the disclosure of which is incorporated herein by reference in entirety.

TECHNICAL FIELD

The application relates to a method for manufacturing semiconductor integrated circuits, and in particular to a process integration method for improving leakage in medium voltage (MV) devices.

BACKGROUND

In a high voltage (HV) IC device manufacturing process at the 28-nm note process platform, medium and high voltage devices, i.e., medium voltage devices and high voltage devices, are inserted on a 28 nm HK platform, and after that, low voltage (LV) devices, medium voltage devices and high voltage devices are integrated together on the same semiconductor substrate, wherein, for example, LV devices are employed as core devices or SRAM devices, and medium voltage devices are employed as input and output (IO) devices. The operating voltage of the LV devices is a few tenths of a volt or a little over one volt, while the operating voltage of the medium voltage devices is several volts such as 8 V, and the gate dielectric layer of the medium voltage devices is thicker than that of the low voltage devices. The operating voltage of the high voltage devices is higher, and field oxide is usually required in the drift region of the devices. In the integration process, the medium voltage devices and core/SRAM devices share the same gate spacers, e.g., an 8-V MV device and 0.9-V core/SRAM device may share the same gate spacers. Because of the hard limit of SRAM's pitch, the gate spacers cannot be too thick, the thickness of the spacer in the application referring to the lateral width of the spacer. As the result, that leads to relatively serious gate induced drain leakage (GIDL) of the MV devices.

Currently in industry, ways to improve GIDL are mainly by the lightly doped drain (LDD) adjustment of the MV devices, but the improvement is limited with a very small process window.

Referring to FIGS. 1A to 1G, they are the schematic diagrams of the cross-sectional structures obtained in the respective steps of the existing method of manufacturing integrated MV devices and LV devices; and the method includes the following steps:

step I., referring to FIG. 1A, providing a semiconductor substrate 103 to form a first gate structure of a MV device and a second gate structure of an LV device on the semiconductor substrate 103, wherein the first gate structure is located in an MV device formation region 101, the second gate structure is located in an LV device formation region 102, the MV device has a first operating voltage, the LV device has a second operating voltage, and the first operating voltage is greater than the second operating voltage. In FIG. 1A, the first gate structure is shown by a dashed box 104a and the second gate structure is shown by a dashed box 104b. In FIG.

1A, both the MV device formation region 101 and the LV device formation region 102 are shown, wherein the MV device formation region 101 is located to the left of a dashed line AA and the LV device formation region 102 is located to the right of a dashed line AA.

In the LV device formation region 102, each of the LV devices is repeatedly arranged at a second pitch, and the integration level is improved by reducing the second pitch; in FIG. 1A, two of the second gate structures are shown, and the second pitch is the sum of the width of the second gate structure and the spacing between the second gate structures. As can be seen, the integration level of the device can be improved by reducing the second pitch.

In the MV device formation region 101, each of the MV devices is repeatedly arranged at the first pitch, the first pitch being larger than the second pitch. In FIG. 1A, only one of the first gate structures is shown, without showing other first gate structures repeatedly arranged. The first pitch is the sum of the width of the first gate structure and the spacing between the first gate structures.

The first gate structure includes a first gate dielectric layer 105a and a first polycrystalline silicon gate 106a stacked in sequence.

The second gate structure includes a second gate dielectric layer 105b and a second polysilicon gate 106b stacked in sequence.

Hard mask layers 107 are also formed at the tops of the first polysilicon gate 106a and the second polysilicon gate 106b.

The thickness of the first gate dielectric layer 105a is greater than that of the second gate dielectric layer 105b, the first gate dielectric layer 105a also extends to the surface of the semiconductor substrate 103 of the MV device formation region 101 outside the region covered by the first polysilicon gate 106a.

The method includes step II., referring to FIG. 1B, depositing a first spacer material layer 108 which covers the top surfaces and sides of the first polysilicon gate 106a and the second polysilicon gate 106b, and the surfaces outside the first polysilicon gate 106a and the second polysilicon gate 106b. The material of the first spacer material layer 108 is carbon-doped silicon nitride (SiCN).

The method includes step III., referring to FIG. 1C, performing an anisotropic etching for the first spacer material layer 108, while forming a first layer of spacers 108a of the medium voltage region at the side of the first polysilicon gate 106a and a first layer of spacers 108b of the low voltage region at the side of the second polysilicon gate 106b.

Before etching the first layers of spacers 108a and 108b, a photoetching process is also used for definition, using SP1-photo as a photomask, with SP1 indicating the first layer of spacers.

Typically, the etching for the first layers of spacers 108a and 108b is followed by a photoetching definition to open the LV device formation region 102, after that, the lightly doped ion implantation is performed for the LV device to form the lightly doped drain region of the LV device, and the lightly doped drain region of the LV device is self-aligned with the sides of the first layers of spacers 108b of the low voltage regions at both sides of the second polysilicon gate 106b.

The method includes step IV., referring to FIG. 1D, depositing a second spacer material layer 109.

Typically, the second spacer material layer 109 includes a first oxide layer and a second silicon nitride layer stacked in sequence.

Referring to FIG. 1E, an anisotropic etching is performed for the second spacer material layer 109 to form a second layer of spacers 109a of a medium voltage region at the side of the first polysilicon gate 106a and a second layer of spacers 109b of a low voltage region at the side of the second polysilicon gate 106b, the first layer of spacers 108a of the medium voltage region and the second layer of spacers 109a of the medium voltage region at the side of the first polysilicon gate 106a are stacked to form the spacer of the medium voltage region, and the first layer of spacers 108b of the low voltage region and the second layer of spacers 109b of the low voltage region at the side of the second polysilicon gate 106b are stacked to form the spacer of the low voltage region. The spacer of the medium voltage region and the spacer of the low voltage region are identical in structure. The thickness of the spacer of the medium voltage region is limited by the thickness of the spacer of the low voltage region.

Generally, the thickness of the spacer of the low voltage region is set according to the second pitch, and the smaller the second pitch is, the smaller the thickness of the spacer of the low voltage region is. That is, when the integration level of the LV devices such as core devices and SRAM devices is determined, the size of the second pitch is also determined and the spacing between the second gate structures is also determined. Since, contact holes (CT) would also need to be formed between the second gate structures, the spacing between the contact holes and the second polysilicon gate is required to be greater than a certain value, the contact holes (CT), the spacing between the contact holes and the second polysilicon gate usually uses the CT to poly distance, which makes the thickness of the spacer of the low voltage region to be greater than or equal to the minimum value required for the CT to poly distance. Obviously, in order to reduce the second pitch, the thickness of the spacer of the low voltage region needs to be reduced, so that the thickness of the spacer of the medium voltage region is also reduced. However, the reduction in the thickness of the spacer of the medium voltage region may increase GIDL leakage.

The method includes step V., referring to FIG. 1F, defining a mask layer formed with a graphical structure by using a photomask 110, wherein the mask layer with the graphical structure opens the MV device formation region 101 and covers the LV device formation region 102.

Then, an anisotropic etching is performed by using the mask layer with the graphical structure as a mask to remove the first gate dielectric layer 105a outside the first polysilicon gate 106a.

The photoetching level of the photomask 110 is IOR-photo, where IOR indicates the removal of the gate dielectric layer in the IO region, i.e., the MV device formation region 101.

The method includes step VI., referring to FIG. 1G, performing source-drain ion implantation to form the first source-drain region 111a of the MV device and the second source-drain region 111b of the LV device; and the first source-drain region 111a is self-aligned with the side of the first polysilicon gate 106a, and the second source-drain region 111b is self-aligned with the side of the second polysilicon gate 106b.

BRIEF SUMMARY

According to some embodiments in this application, a process integration method for improving leakage in MV devices is disclosed in the following steps.

Step I: providing a semiconductor substrate, forming a first gate structure of the MV device and a second gate structure of an LV device on the semiconductor substrate, wherein the first gate structure is disposed in an MV device formation region, wherein the second gate structure is disposed in an LV device formation region, wherein the MV device has a first operating voltage, the LV device has a second operating voltage, and wherein the first operating voltage is greater than the second operating voltage; and forming a first gate dielectric layer and a first gate conducting material layer stacked in sequence in the first gate structure;

forming a second gate dielectric layer and a second gate conducting material layer stacked in sequence in the second gate structure.

A thickness of the first gate dielectric layer is greater than a thickness of the second gate dielectric layer, and wherein the first gate dielectric layer extends along a surface of the semiconductor substrate in the MV device formation region outside the first gate conducting material layer.

Step II: depositing a first spacer material layer on a top surface and sides of the first gate conducting material layer, a top surface and sides of the second gate conducting material layer, and the surface of the semiconductor substrate outside the first gate conducting material layer and the second gate conducting material layer.

Step III: porming an additional spacer material layer on a surface of the first spacer material layer, wherein the additional spacer material layer comprises a different material than a material of the first spacer material layer.

Step IV: forming a first mask layer to cover the MV device formation region, wherein the first mask layer leaves the LV device formation region open.

Step V: performing an isotropic first etching to remove the additional spacer material layer from the LV device formation region, wherein the isotropic first etching stops at the first spacer material layer.

Step VI: performing an anisotropic second etching to remove the first spacer material layer from the top surface and surfaces outside the second gate conducting material layer in the LV device formation region, and form a first layer of spacers on sides of the second gate conducting material layer.

Step VII: removing the first mask layer and forming a second mask layer, wherein the second mask layer opens the MV device formation region and covers the LV device formation region.

Step VIII: performing an anisotropic third etching with the second mask layer, wherein the anisotropic third etching sequentially removes a portion of the additional spacer material layer, a portion of the first spacer material layer, and the first gate dielectric layer from the top surface of the first gate conducting material layer and surfaces outside the first gate conducting material layer, wherein the first spacer material layer remaining at the sides of the first gate conducting material layer constitutes the first layer of spacers of the medium voltage region, and wherein the additional spacer material layer remaining at the sides of the first gate conducting material layer constitutes the additional spacer of the MV device forming region; removing the second mask layer.

Step IX: depositing a second spacer material layer; and performing an anisotropic fourth etching to the second spacer material layer to form a second layer of spacers of the MV device forming region at the sides of the first gate conducting material layer and a second layer of spacers of the LV device forming region at the sides of the second gate conducting material layer, wherein the spacer of the MV device forming region comprise the first layer of spacers, the additional spacers and the second layer of spacers stacked together at the sides of the first gate conducting material layer in the MV device forming region, wherein the spacer of the LV device forming region comprise the first layer of spacers and the second layer of spacers stacked at the sides of the second gate conducting material layer; and wherein the additional spacer increases a thickness of the spacer of the MV device forming region to be greater than a thickness of the spacer of the LV device forming region, so as to reduce a leakage in the MV device.

According to one embodiment, in step I, the semiconductor substrate includes a silicon substrate.

According to one embodiment, the material of the first gate dielectric layer includes an oxide layer or a high dielectric constant layer.

The material of second gate dielectric layer includes an oxide layer or a high dielectric constant layer.

The material of the first gate conducting material layer includes polycrystalline silicon.

The material of the second gate conducting material layer includes polycrystalline silicon.

According to one embodiment, the material of the first spacer material layer includes silicon nitride or carbon doped silicon nitride.

The material of the additional spacer material layer includes an oxide layer.

According to one embodiment, the oxide layer used for the additional spacer material layer is formed by deposition with a tetraethyl orthosilicate (TEOS) layer in a chemical vapor deposition (CVD) process.

According to one embodiment, the second spacer material layer includes a first oxide layer and a second silicon nitride layer stacked in sequence.

According to one embodiment, in the LV device formation region, each of the LV devices is repeatedly arranged at a second pitch, and the integration level is improved by reducing the second pitch; and the thickness of the spacer of the low voltage region is set according to the second pitch, and the smaller the second pitch is, the smaller the thickness of the spacer of the low voltage region.

In the MV device formation region, each of the MV devices is repeatedly arranged at the first pitch, the first pitch being larger than the second pitch According to one embodiment, the thickness of the spacer of the medium voltage region is set to be greater than or equal to the first thickness.

The first thickness is the minimum thickness required for the spacer of the medium region when GIDL leakage is completely suppressed for the MV device at a source-drain voltage which is the first operating voltage.

According to one embodiment, the thickness of the spacer of the medium voltage region is less than or equal to the maximum spacing between the source contact hole of the MV device and the first gate conducting material layer.

According to one embodiment, the first thickness is about 500 Å when the first operating voltage is 8 V.

According to one embodiment, the thickness of the additional spacer is in a range between 150 Å and 250 Å.

According to one embodiment, the thickness of the first oxide layer is about 20 Å and the thickness of the second silicon nitride layer is about 200 Å.

According to one embodiment, in step V, the first etching is performed by wet etching including hydrofluoric acid.

According to one embodiment, the second etching in step VI is performed by dry etching.

The third etching in step VIII is performed by dry etching.

The fourth etching in step IX is performed by dry etching.

According to one embodiment, the method further includes:

step X. performing source drain ion implantation to form the first source and drain regions of the MV device and the second source and drain regions of the LV device, wherein the first source and drain regions are self-aligned with the sides of the first gate conducting material layer, and wherein the second source and drain regions are self-aligned with the sides of the second gate conducting material layer.

According to one embodiment, in step VI, after the first layer of spacers of the low voltage region is formed, the method further includes a step of performing lightly doped ion implantation to form the lightly doped drain region of the LV device, wherein the lightly doped drain region of the LV device is self-aligned with the side of the first layer of spacers of the low voltage region at both sides of the second gate conducting material layer.

In the application, by enabling the insertion of additional spacers in the spacer of the medium voltage region of the MV device, the thickness of the spacer of the medium voltage region is not limited by the thickness of the spacer of the low voltage region of the LV device, thereby increasing the thickness of the spacer of the medium voltage region to increase the spacing between the drain region and the channel region, and thus the leakage of the MV device, particularly the GIDL leakage, can be reduced.

In the application, the additional spacer material layer is formed after the formation of the first spacer material layer, then, after opening the LV device formation region, an isotropic first etching removes the additional spacer material layer from the LV device formation region, and so there is no additional spacers in the LV device formation region, and the formation of the additional spacers in the MV device formation region are enabled further by the anisotropic etching for the LV device formation region, the anisotropic etching for the MV device formation region, and the deposition and anisotropic etching for the second spacer material layer. The above process can be realized only by combining the photomask in the opened region and the etching process without additional photomasks, and is easy to implement and inexpensive.

In addition, in the application, the formation process of the additional spacer material layer is after the formation of the first spacer material layer, instead of after the formation of the second spacer material layer, it is less likely to create sealing of the spacing region between the second gate conducting material layers of the LV device formation region during the formation of the additional spacer material layer, thus improving process windows.

BRIEF DESCRIPTION OF THE DRAWINGS

The application is described in further detail below in conjunction with the figures and detailed description.

FIG. 2 is a flow diagram of a process integration method for improving the leakage in MV devices according to the embodiments of the application;

DETAILED DESCRIPTION OF THE DISCLOSURE

Figure 1A:
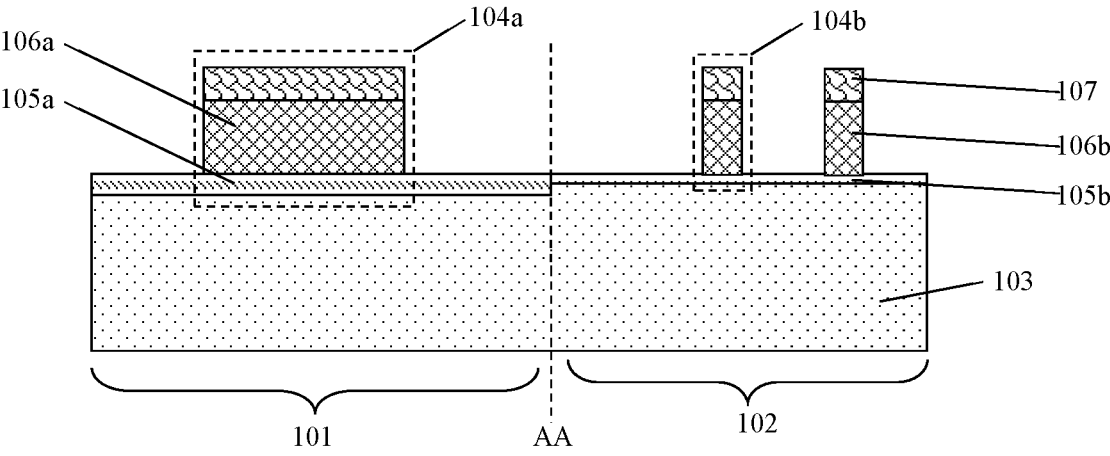
FIGS. 1A-1G are the schematic diagrams of the cross-sectional structures obtained at the respective steps of the existing method of manufacturing integrated MV devices and LV devices.
Figure 1B:
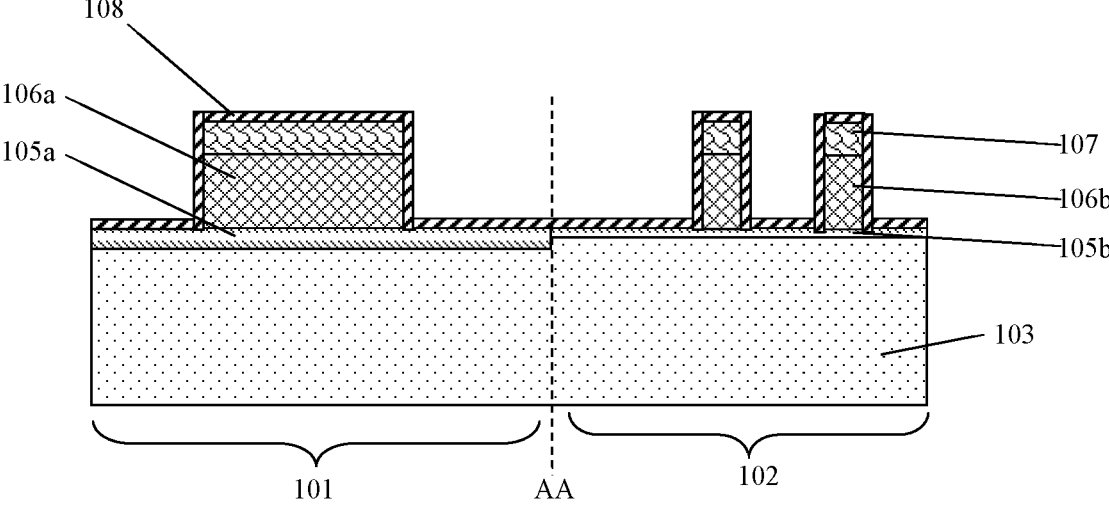
Figure 1C:
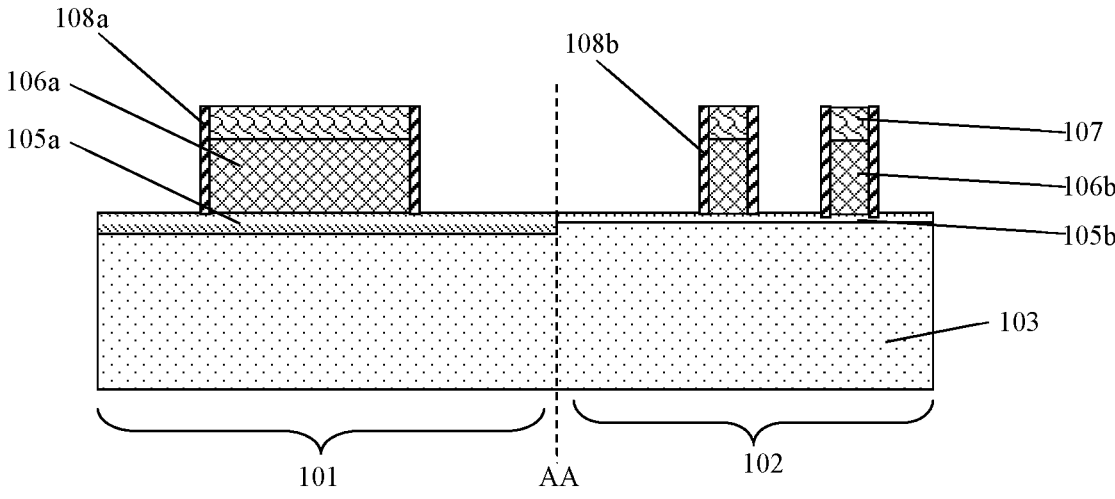
Figure 1D:
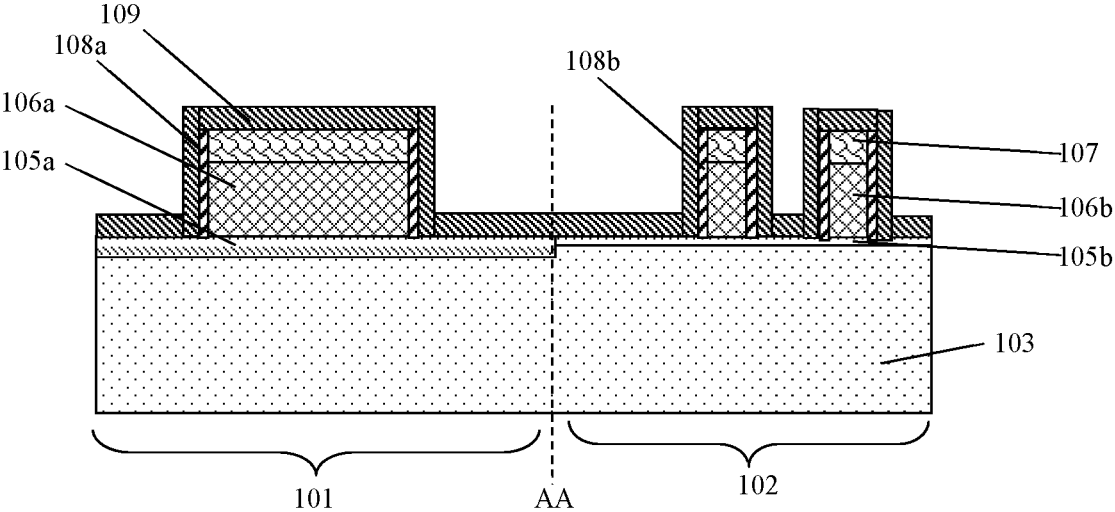
Figure 1E:
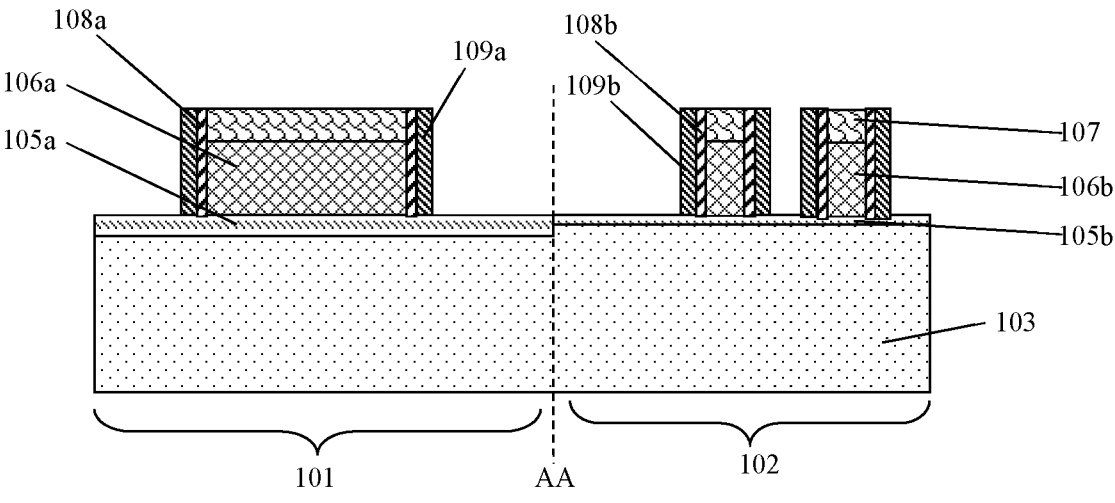
Figure 1F:
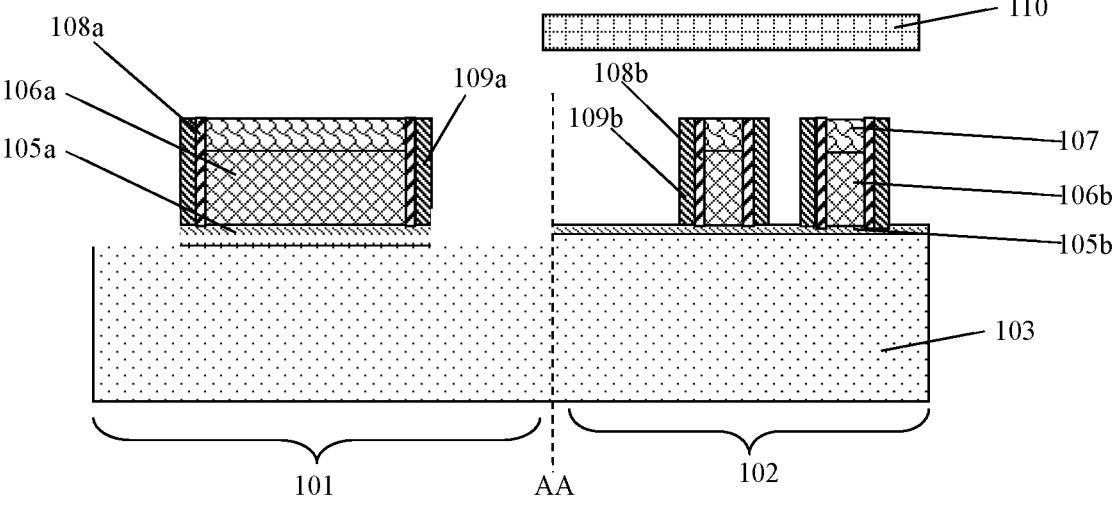
Figure 1G:
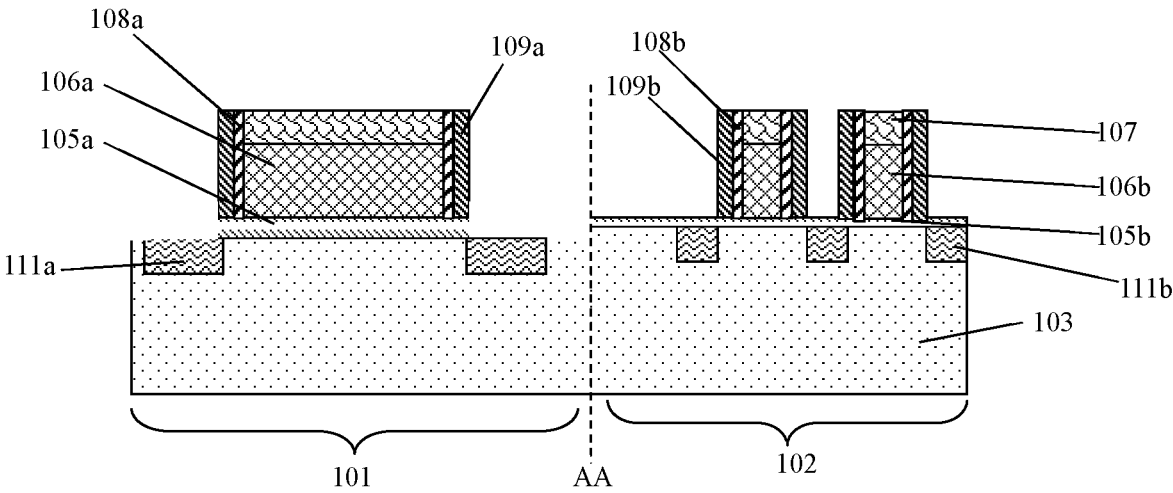
Figure 3A:
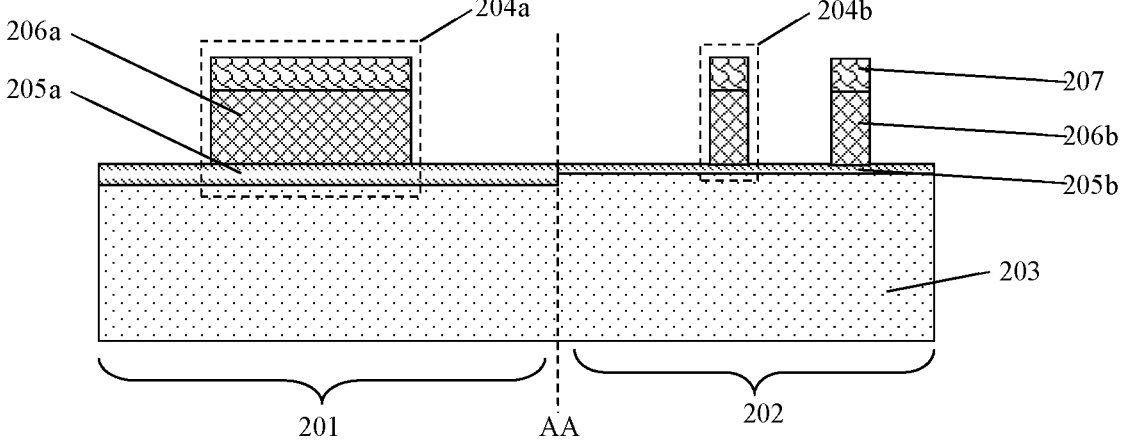
FIGS. 3A-3J are the schematic diagrams of the cross-sectional structures obtained at the respective steps of the process integration method for improving leakage in MV devices according to the embodiments of the application.

Referring to FIG. 2, it is a flow diagram of a process integration method for improving leakage in MV devices of the embodiments of the application; and referring to FIG. 3A to FIG. 3J, they are the schematic diagrams of the cross-sectional structures obtained in the respective steps of the process integration method for improving leakage in MV devices according to the embodiments of the application. The process integration method for improving leakage in MV devices of the embodiments of the application includes the following steps:

step I., referring to FIG. 3A, providing a semiconductor substrate 203 to form a first gate structure of an MV device and a second gate structure of an LV device on the semiconductor substrate 203, wherein the first gate structure is located in an MV device formation region 201, the second gate structure is located in the LV device formation region 202, the MV device has a first operating voltage, the LV device has a second operating voltage, and the first operating voltage is greater than the second operating voltage. In FIG. 3A, the first gate structure is shown in a dashed box 204a and the second gate structure is shown in a dashed box 204b. In FIG. 3A, both the MV device formation region 201 and the LV device formation region 202 are shown, the MV device formation region 201 is located at the left of the dashed line AA and the LV device formation region 202 is located at the right of a dashed line AA.

In the LV device formation region 202, each of the LV devices is repeatedly arranged at a second pitch, and the integration level is improved by reducing the second pitch; and in FIG. 3A, two of the second gate structures are shown, and the second pitch is the sum of the width of the second gate structure and the spacing between the second gate structures. As can be seen, the integration level of the device can be improved by reducing the second pitch.

In the MV device formation region 201, each of the MV devices is repeatedly arranged at the first pitch, the first pitch being larger than the second pitch. In FIG. 3A, only one of the first gate structures is shown, other first gate structures are repeatedly arranged but they are not shown in the figure. The first pitch is the sum of the width of the first gate structure and the spacing between the first gate structures.

The MV device includes an input-output (IO) device, and the LV device includes a core device and an SRAM device.

The first gate structure includes a first gate dielectric layer 205a and a first gate conducting material layer 206a stacked in sequence.

The second gate structure includes a second gate dielectric layer 205b and a second gate conducting material layer 206b stacked in sequence.

Hard mask layers 207 are also formed at the tops of the first gate conducting material layer 206a and the second gate conducting material layer 206b.

The thickness of the first gate dielectric layer 205a is greater than that of the second gate dielectric layer 205b, and the first gate dielectric layer 205a also extends along the surface of the semiconductor substrate 203 in the MV device formation region 201 outside the first gate conducting material layer 206a.

In the embodiment of the application, the semiconductor substrate 203 includes a silicon substrate.

The material of the first gate dielectric layer 205a includes an oxide layer or a high dielectric constant layer.

The material of the second gate dielectric layer 205b includes an oxide layer or a high dielectric constant layer.

The material of the first gate conducting material layer 206a includes polycrystalline silicon.

The material of the second gate conducting material layer 206b includes polycrystalline silicon.

Figure 3B:
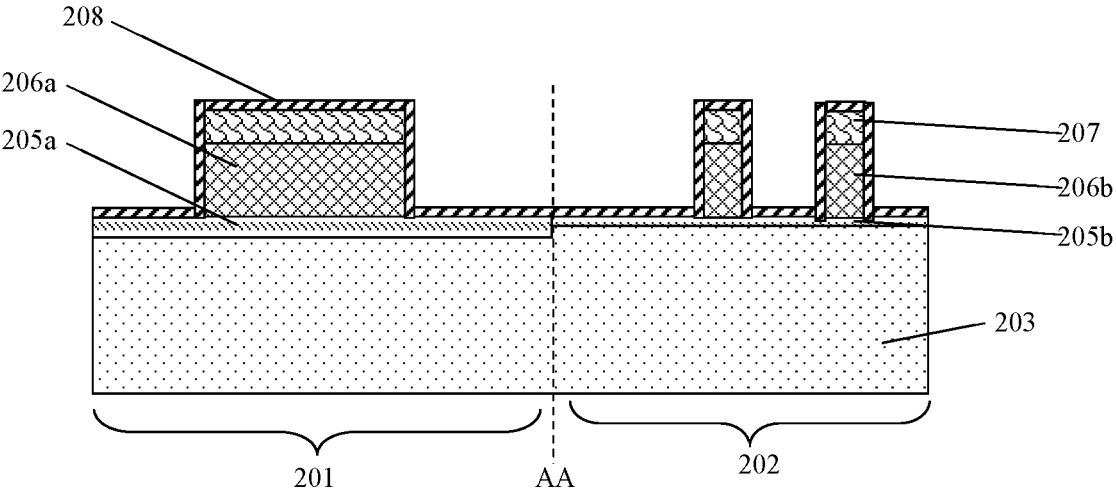

The method includes step II., referring to FIG. 3B, depositing a first spacer material layer 208 which on the top surfaces and sides of the first gate conducting material layer 206a and the second gate conducting material layer 206b, and the surface of the substrate outside the first gate conducting material layer 206a and the second gate conducting material layer 206b.

In the embodiments of the application, the material of the first spacer material layer 208 is carbon-doped silicon nitride. In other embodiments, the material of the first spacer material layer 208 is silicon nitride.

Figure 3C:
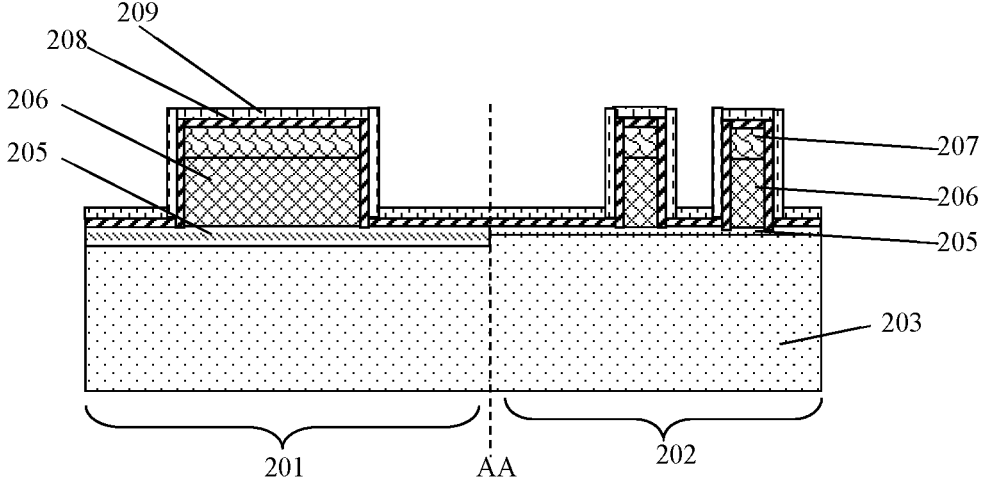

The method includes step III., referring to FIG. 3C, forming an additional spacer material layer 209a on the surface of the first spacer material layer 208, wherein the additional spacer material layer 209a is of a different material than the first spacer material layer 208.

In the embodiments of the application, the material of the additional spacer material layer 209a includes an oxide layer. In some preferred embodiments, the oxide layer used in the additional spacer material layer 209a is formed by deposition a TEOS layer with a CVD process. The TEOS CVD process indicates a chemical vapor deposition process in which TEOS is used as a silicon source. The oxide layer formed by the TEOS CVD process is also referred to as a TEOS oxide layer.

Compared with nitrogen-doped silicon nitride, the TEOS oxide layer has a very high etching selection ratio under hydrofluoric acid. The etch rate of TEOS oxide layer to etch rate of carbon-doped silicon nitride under hydrofluoric acid is higher than 30:1.

Figure 3D:
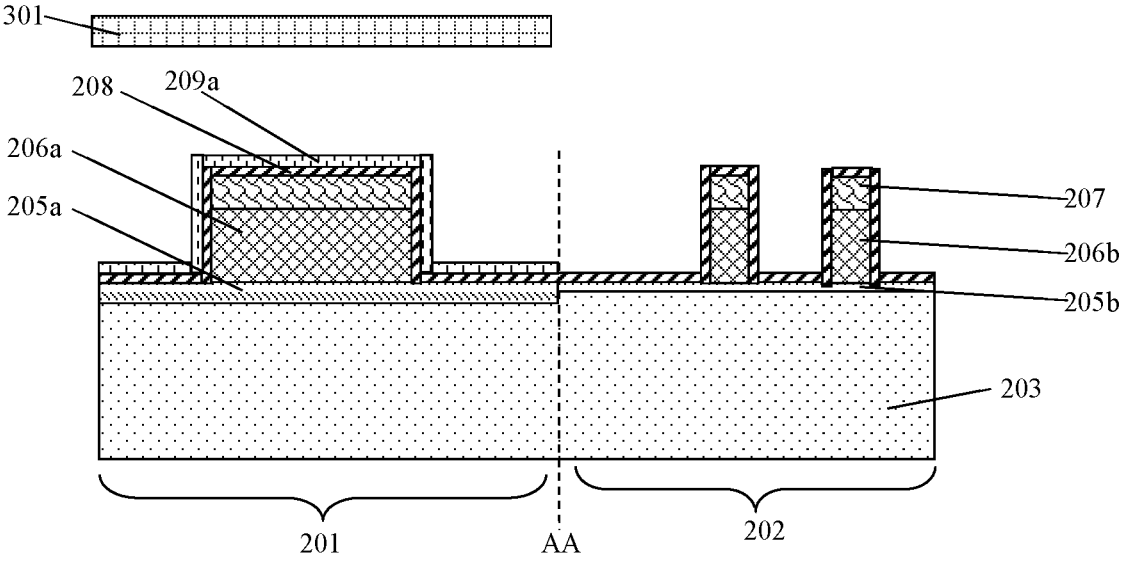

The method includes step IV, referring to FIG. 3D, forming a first mask layer (can be the photomask 301) to cover the MV device formation region 201 and open the LV device formation region 202.

In FIG. 3D, the graphical structure of the first mask layer is can be a photomask 301, and the photoetching level of the used photomask 301 is spacer 1 (SP1)-photo, SP1 indicating the first layer of spacers. The photoetching level corresponding to the SP1-photo is compatible with the current integration process, and thus, no additional photoetching level is added.

The method includes step V., referring to FIG. 3D, performing an isotropic first etching to remove the additional spacer material layer 209a from the LV device formation region 202 by using the first mask layer as a mask and the first spacer material layer 208 as a stop layer.

In the embodiment of the application, the first etching is performed by wet etching, and the solution of the wet etching includes hydrofluoric acid.

Figure 3E:
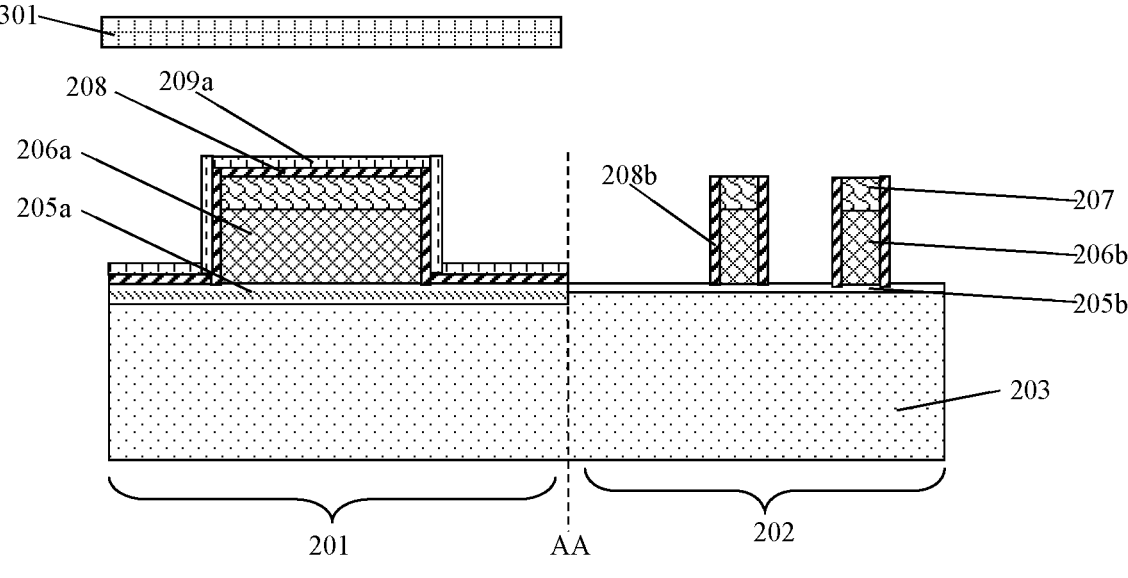

The method includes step VI, referring to FIG. 3E, performing an anisotropic second etching for the first spacer material layer 208 by using the first mask layer as a mask to form a first layer of spacers 208b of the low voltage region at the side of the second gate conducting material layer 206b, wherein the first spacer material layers 208 located at the top surface and outside of the second gate conducting material layer 206b in the LV device formation region 202 are removed.

In the embodiment of the application, the second etching in step VI is performed by dry etching.

After the first layer of spacers 208 of the blow voltage region is formed, a step of performing lightly doped ion implantation to form the lightly doped drain region of the LV device is also included, and the lightly doped drain region of the LV device is self-aligned with the sides of the first layer of spacers 208 of the blow voltage region at both sides of the second gate conducting material layer 206b.

Figure 3F:
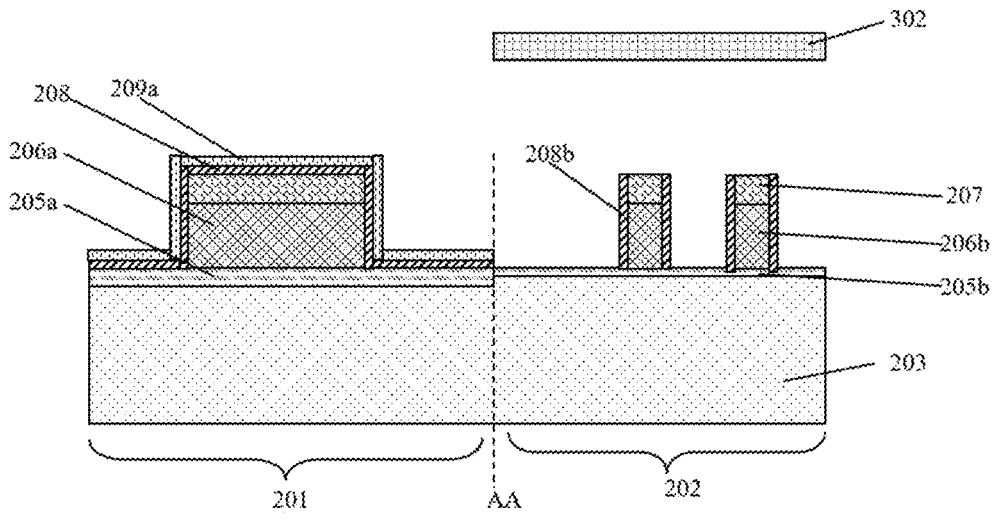

The method includes step VII., referring to FIG. 3F, removing the first mask layer and forming a second mask layer (not shown), wherein the second mask layer opens the MV device formation region 201 and covers the LV device formation region 202.

In FIG. 3F, the graphical structure of the second mask layer is defined by using a photomask 302, and the photoetching level of the used photomask 302 is IOR-photo, IOR indicating the removal of the gate dielectric layer in an IO region, i.e., the MV device formation region 201. The photoetching level corresponding to IOR-photo is compatible with the integration process, and thus, no additional photoetching level is added.

Figure 3G:
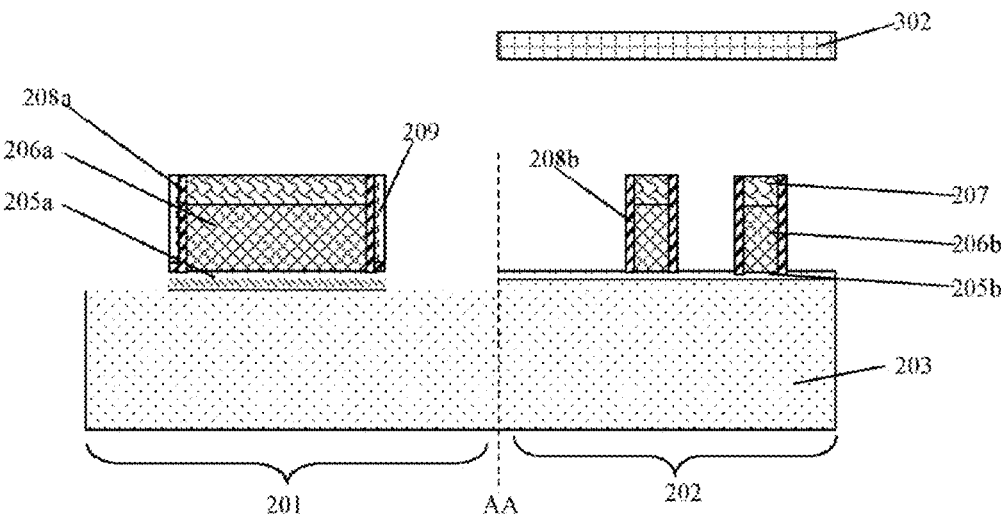

The method includes step VIII., referring to FIG. 3G, performing an anisotropic third etching with the second mask layer as a mask, wherein the third etching sequentially removes the additional spacer material layer 209a, the first spacer material layer 208, and the first gate dielectric layer 205a of the top surface and outside of the first gate conducting material layer 206a, the first spacer material layer 208 remaining at the side of the first gate conducting material layer 206a consists of the first layer of spacers 208a of the medium voltage region, and the additional spacer material layer 209a remaining at the side of the first gate conducting material layer 206a consists of an additional spacer 209; and after that, the second mask layer is removed.

In the embodiment of the application, the third etching is performed by dry etching.

Figure 3H:
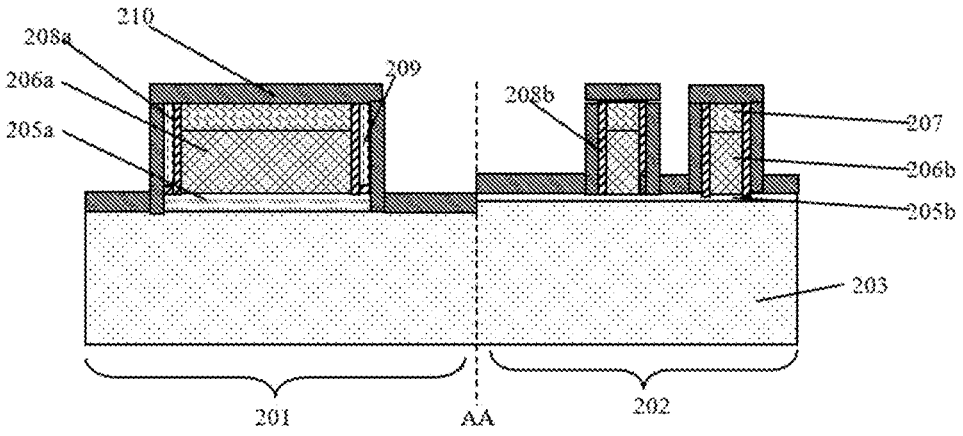

The method includes step IX, referring to FIG. 3H, depositing a second spacer material layer 210.

In the embodiment of the application, the second spacer material layer 210 includes a first oxide layer and a second silicon nitride layer stacked in sequence.

Figure 3I:
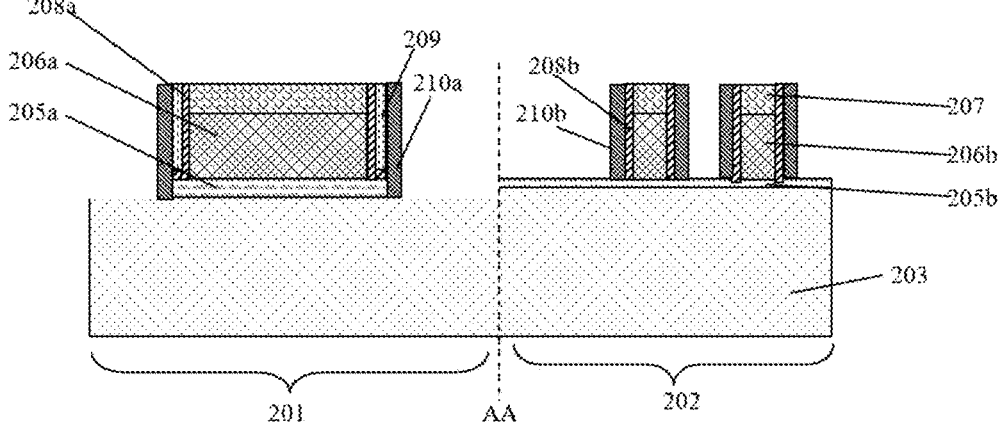

Referring to FIG. 3I, an anisotropic fourth etching for the second spacer material layer 210 is performed to form a second layer of spacers 210a of the medium voltage region at the side of the first gate conducting material layer 206a and a second layer of spacers 210b of the low voltage region at the side of the second gate conducting material layer 206b, wherein the spacer of the medium voltage region is formed by stacking the first layer of spacers 208a of the medium voltage region, the additional spacer 209 and the second layer of spacers 210a of the medium voltage region at the side of the first gate conducting material layer 206a, the spacer of the low voltage region is formed by stacking the first layer of spacers 208b of the low voltage region, and the second layer of spacers 201b of the low voltage region at the side of the second gate conducting material layer 206b, and the additional spacer 209 enables the thickness of the spacer of the medium voltage region greater than that of the spacer of the low voltage region to reduce leakage in the MV device.

In the embodiment of the application, the fourth etching is performed by dry etching.

The thickness of the spacer of the low voltage region is set according to the second pitch, and the smaller the second pitch is, the smaller the thickness of the spacer of the low voltage region is. That is, when the integration level of the LV devices such as core devices and SRAM devices is determined, the size of the second pitch is also determined and the spacing between the second gate structures is also determined. Since, contact holes (CT) would also need to be formed between the second gate structures, the spacing between the contact holes and the second gate conducting material layer is required to be greater than a certain value, and the contact holes (CT), the spacing between the contact holes and the second gate conducting material layer usually uses the CT to poly distance, which makes the thickness of the spacer of the low voltage region to be greater than or equal to the minimum value required for the CT to poly distance.

In some preferred embodiments, the thickness of the spacer of the medium voltage region is set to be greater than or equal to the first thickness.

The first thickness is the minimum thickness required for the spacer of the medium region when GIDL leakage is completely suppressed for the MV device at a source-drain voltage which is the first operating voltage.

Figure 4:
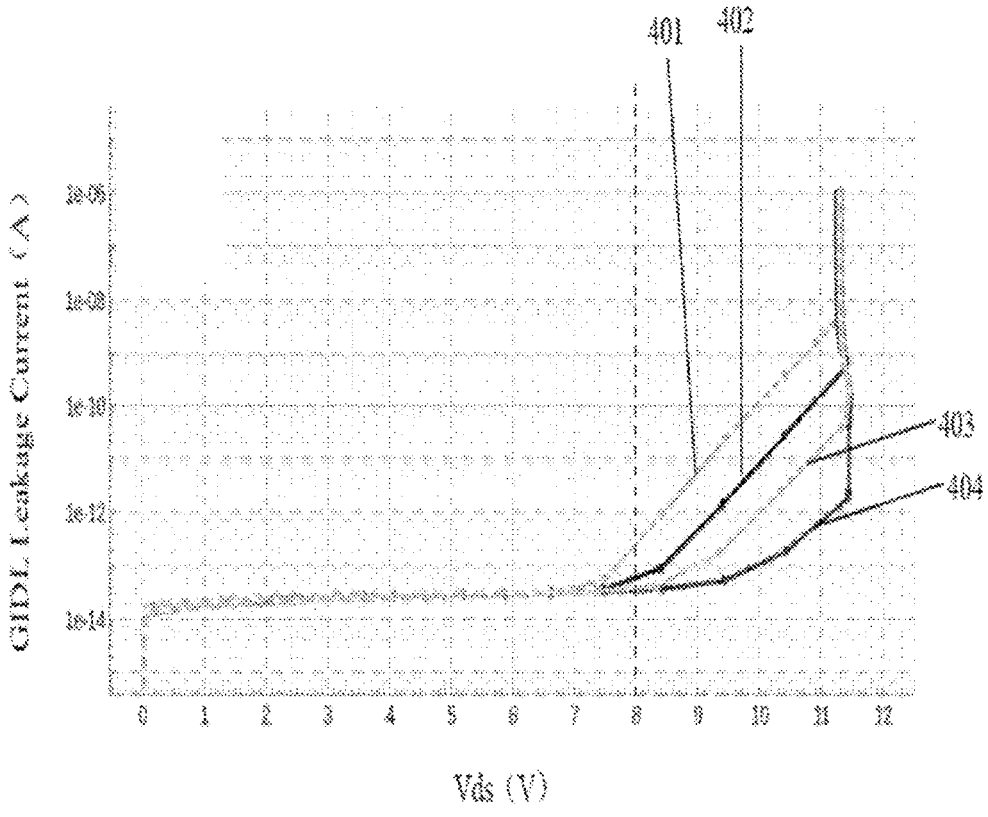
FIG. 4 is a simulated curve of a GIDL leakage current of an MV device formed when the thickness of the gate spacer of the medium voltage region is changed according to the process integration method for improving leakage in MV devices of the embodiments of the application.

Since the thickness adjustment of the spacer of the medium voltage region can be achieved in the application, it is necessary to determine the first thickness experimentally in advance in order to obtain the best result, i.e., to achieve complete suppression of GIDL leakage of the MV device. For this purpose, the GIDL leakage of the MV device is measured at the first operating voltage when the thickness of the spacer of the medium voltage region is changed, and then, the minimum thickness, in which the GIDL leakage can be completely suppressed, is selected as the first thickness. Referring to FIG. 4, which is a simulation curve of a GIDL leakage current of an MV device formed when the thickness of the spacer of the medium voltage region is changed in the process integration method for improving leakage in MV devices of the embodiments of the application, curves 403 and 404 show no GIDL leakage current when the first operating voltage, i.e., a source leakage voltage Vds, is 8 V, while curves 401 and 402 both show GIDL leakage currents. Thus, the thicknesses of the spacer of the medium voltage regions corresponding to the curves 403 and 404 are within the embodiments of the application. Here, the thickness of the spacer of the medium voltage region corresponding to the curve 401 is about 300 Å, the thickness of the spacer of the medium voltage region corresponding to the curve 402 is about 400 Å, the thickness of the spacer of the medium voltage region corresponding to the curve 403 is about 500 Å, and the thickness of the spacer of the medium voltage region corresponding to the curve 404 is about 800 Å. Hence, at the first operating voltage of 8 V, the first thickness of 500 Å can be selected.

In addition, in the embodiment of the application, the thickness of the spacer of the medium voltage region is also limited by the first pitch. At a determined first pitch, the spacing between the first gate structures is also determined. Since it is needed to ensure a contact hole to be formed between the first gate structures, a certain spacing needs to be maintained between the first gate conducting material layer and the adjacent contact hole. Thus, the thickness of the spacer of the medium voltage region needs to be less than or equal to the maximum spacing between the MV device's source contact hole and the first gate conducting material layer 206a. Since in the embodiment of the application, the thickness of the spacer of the medium voltage region is obtained by adding the thickness of the additional spacer 209 to the thickness of the spacer of the low voltage region, the thickness of the spacer of the medium voltage region is actually adjusted by the thickness of the additional spacer 209. In some preferred embodiments, the thickness of the first oxide layer is about 20 Å and the thickness of the second silicon nitride layer is about 200 Å. The 23 thickness of the additional spacer 209 is in a range between 150 Å and 250 Å.

Figure 3J:
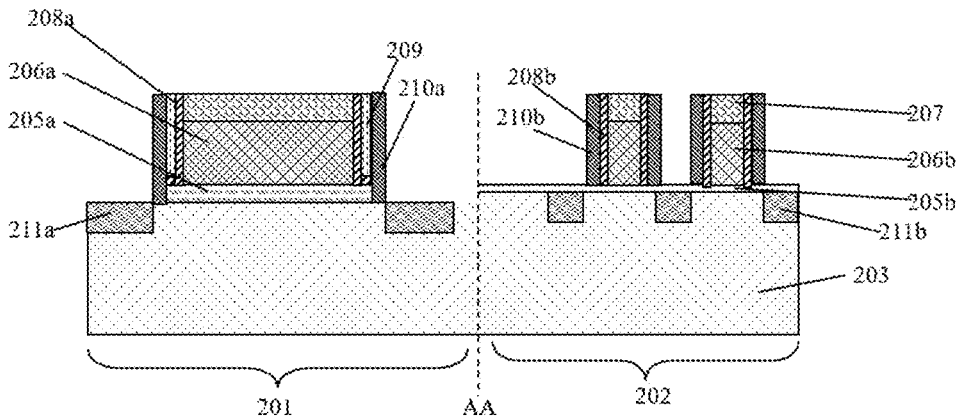

The method also includes: step X., referring to FIG. 3J, performing source-drain ion implantation to form the first source drain region 211a of the MV device and the second source drain region 211b of the LV device, wherein the first source drain region 211a is self-aligned with the side of the first gate conducting material layer 206a, and the second source drain region 211b is self-aligned with the side of the second gate conducting material layer 206b.

In the embodiment of the application, by enabling the insertion of additional spacers 209 in the spacer of the medium voltage region of the MV device, the thickness of the spacer of the medium voltage region is not limited by the thickness of the spacer of the low voltage region of the LV device, thereby increasing the thickness of the spacer of the medium voltage region to increase the spacing between drain region and the channel region, and thus the leakage of the MV device, particularly the GIDL leakage, can be reduced.

In the embodiment of the application, the additional spacer material layer 209a is formed after the formation of the first spacer material layer 208, then, after opening the LV device formation region 202, the isotropic first etching is added to remove the additional spacer material layer 209a from the LV device formation region 202, and the avoiding of the formation of the additional spacers 209 in the LV device formation region 202, and the formation of the additional spacers 209 in the MV device formation region 201 are enabled further by the anisotropic etching for the LV device formation region 202, the anisotropic etching for the MV device formation region 201, and the deposition and anisotropic etching for the second spacer material layer 210. The above process can be realized only by combining the photomask in the opened region and the etching process without additional photomasks, and is easy to implement and inexpensive.

In addition, in the embodiment of the application, the formation process of the additional spacer material layer 209a is after the formation of the first spacer material layer 208, instead of after the formation of the second spacer material layer 210, it is less likely to create sealing of the spacing region between the second gate conducting material layers 206b of the LV device formation region 202 during the formation of the additional spacer material layer 209a, thus improving process windows.

The detailed description of the application has been provided above by means of specific embodiments, but it is not intended to limit the application. Without departing from the principle of the application, those skilled in the art can make many variations and improvements which are also within the scope of protection of the application.

What is claimed is:

1. A method of process integration for improving leakage in a MV device, comprising:

step I: providing a semiconductor substrate, forming a first gate structure of the MV device and a second gate structure of an LV device on the semiconductor substrate, wherein the first gate structure is disposed in an MV device formation region, wherein the second gate structure is disposed in an LV device formation region, wherein the MV device has a first operating voltage, the LV device has a second operating voltage, and wherein the first operating voltage is greater than the second operating voltage;

forming a first gate dielectric layer and a first gate conducting material layer stacked in sequence in the first gate structure; and forming a second gate dielectric layer and a second gate conducting material layer stacked in sequence in the second gate structure, wherein a thickness of the first gate dielectric layer is greater than a thickness of the second gate dielectric layer, and wherein the first gate dielectric layer extends along a surface of the semiconductor substrate in the MV device formation region outside the first gate conducting material layer;

step II: depositing a first spacer material layer on a top surface and sides of the first gate conducting material layer, a top surface and sides of the second gate conducting material layer, and the surface of the semiconductor substrate outside the first gate conducting material layer and the second gate conducting material layer;

step III: performing an additional spacer material layer on a surface of the first spacer material layer, wherein the additional spacer material layer comprises a different material than a material of the first spacer material layer;

step IV: forming a first mask layer to cover the MV device formation region, wherein the first mask layer leaves the LV device formation region open;

step V: performing an isotropic first etching to remove the additional spacer material layer from the LV device formation region, wherein the isotropic first etching stops at the first spacer material layer;

step VI: performing an anisotropic second etching to remove the first spacer material layer from the top surface and surfaces outside the second gate conducting material layer in the LV device formation region, and form a first layer of spacers on sides of the second gate conducting material layer;

step VII: removing the first mask layer and forming a second mask layer, wherein the second mask layer opens the MV device formation region and covers the LV device formation region;

step VIII: performing an anisotropic third etching with the second mask layer, wherein the anisotropic third etching sequentially removes a portion of the additional spacer material layer, a portion of the first spacer material layer, and the first gate dielectric layer from the top surface of the first gate conducting material layer and surfaces outside the first gate conducting material layer, wherein the first spacer material layer remaining at the sides of the first gate conducting material layer constitutes the first layer of spacers of a medium voltage region, and wherein the additional spacer material layer remaining at the sides of the first gate conducting material layer constitutes an additional spacer of the MV device forming region;

removing the second mask layer; and step IX: depositing a second spacer material layer;

performing an anisotropic fourth etching to the second spacer material layer to form a second layer of spacers of the MV device forming region at the sides of the first gate conducting material layer and a second layer of spacers of the LV device forming region at the sides of the second gate conducting material layer, wherein the spacer of the MV device forming region comprises the first layer of spacers, the additional spacer, and the second layer of spacers stacked together at the sides of the first gate conducting material layer in the MV device forming region, wherein the spacer of the LV device forming region comprises the first layer of spacers and the second layer of spacers stacked at the sides of the second gate conducting material layer; and wherein the additional spacer increases a thickness of the spacer of the MV device forming region to be greater than a thickness of the spacer of the LV device forming region, so as to reduce a leakage in the MV device, wherein the LV device formation region comprises multiple LV devices, wherein the LV devices are arranged repeatedly at a second pitch, wherein an integration level is improved by reducing the second pitch, and wherein the thickness of the spacers of the LV device forming region has a monotonic relation to the second pitch, a smaller second pitch leads to a smaller thickness of the spacers of the LV device forming region, and wherein the MV device formation region comprises multiple MV devices, wherein the MV devices are arranged repeatedly at a first pitch, and wherein the first pitch is larger than the second pitch.

2. The method of process integration for improving leakage in the MV device according to claim 1, wherein, in step I, the semiconductor substrate comprises a silicon substrate.

3. The method of process integration for improving leakage in the MV device according to claim 2, wherein a material of the first gate dielectric layer comprises an oxide layer or a high dielectric constant layer;

wherein a material of the second gate dielectric layer comprises an oxide layer or a high dielectric constant layer;

wherein a material of the first gate conducting material layer comprises polycrystalline silicon; and wherein a material of the second gate conducting material layer comprises polycrystalline silicon.

4. The method of process integration for improving leakage in the MV device according to claim 1, wherein a material of the first spacer material layer comprises silicon nitride or carbon doped silicon nitride, and wherein a material of the additional spacer material layer comprises an oxide layer.

5. The method of process integration for improving leakage in the MV device according to claim 4, wherein the oxide layer in the additional spacer material layer is formed by depositing a tetraethyl orthosilicate (TEOS) chemical vapor deposition (CVD) process.

6. The method of process integration for improving leakage in the MV device according to claim 4, wherein the second spacer material layer comprises a first oxide layer and a second silicon nitride layer stacked in sequence.

7. The method of process integration for improving leakage in the MV device according to claim 1, wherein the thickness of the spacer of the MV device forming region is set to be greater than or equal to a first thickness, wherein the first thickness is a minimum thickness required for the spacer of the MV device forming region when gate induced drain leakage (GIDL) is suppressed for the MV device at a source-drain voltage which is the first operating voltage.

8. The method of process integration for improving leakage in the MV device according to claim 7, wherein the thickness of the spacer of the MV device forming region is less than or equal to a maximum spacing between a source contact hole and the first gate conducting material layer of the MV device.

9. The method of process integration for improving leakage in the MV device according to claim 7, wherein the first thickness is about 500 Å when the first operating voltage is 8 V.

10. The method of process integration for improving leakage in the MV device according to claim 7, wherein the thickness of the additional spacer is in a range between 150 Å and 250 Å.

11. The method of process integration for improving leakage in the MV device according to claim 6, wherein a thickness of the first oxide layer is about 20 Å and a thickness of the second silicon nitride layer is about 200 Å.

12. The method of process integration for improving leakage in the MV device according to claim 5, wherein, in step V, the isotropic first etching is performed by wet etching comprising hydrofluoric acid.

13. The method of process integration for improving leakage in the MV device according to claim 4, wherein the anisotropic second etching in step VI is performed by dry etching;

wherein the anisotropic third etching in step VIII is performed by dry etching; and wherein the anisotropic fourth etching in step IX is performed by dry etching.

14. The method of process integration for improving leakage in the MV device according to claim 1, wherein the method further comprises:

step X: performing source drain ion implantation to form first source and drain regions of the MV device and second source and drain regions of the LV device, wherein the first source and drain regions are self-aligned with the sides of the first gate conducting material layer, and wherein the second source and drain regions are self-aligned with the sides of the second gate conducting material layer.

15. The method of process integration for improving leakage in the MV device according to claim 14, wherein, in step VI, after forming the first layer of spacers of the LV device forming region, the method further comprises a step of performing lightly doped ion implantation to form a lightly doped drain region of the LV device, wherein the lightly doped drain region of the LV device is self-aligned with the sides of the first layer of spacers of the LV device forming region at sides of the second gate conducting material layer.

* * * * *